(12) United States Patent
Yamamoto

(10) Patent No.: US 10,532,411 B2
(45) Date of Patent: Jan. 14, 2020

(54) CHUCK TABLE AND METHOD OF MANUFACTURING SUCTION PLATE OF POROUS CERAMICS

(71) Applicant: DISCO CORPORATION, Tokyo (JP)

(72) Inventor: Setsuo Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 37 days.

(21) Appl. No.: 15/679,725

(22) Filed: Aug. 17, 2017

(65) Prior Publication Data

US 2018/0065187 A1 Mar. 8, 2018

(30) Foreign Application Priority Data

Sep. 6, 2016 (JP) .................................. 2016-173794

(51) Int. Cl.
*H01L 21/683* (2006.01)
*B23B 31/30* (2006.01)
*H01L 21/68* (2006.01)
*H01L 21/687* (2006.01)

(52) U.S. Cl.
CPC .......... *B23B 31/307* (2013.01); *H01L 21/682* (2013.01); *H01L 21/6838* (2013.01); *H01L 21/68785* (2013.01); *H01L 21/6836* (2013.01)

(58) Field of Classification Search
CPC ... B23B 31/307; B23B 2226/18; B23Q 3/088; H01L 21/68785; H01L 21/682; H01L 21/6838; H01L 21/6836
See application file for complete search history.

(56) References Cited

U.S. PATENT DOCUMENTS

| | | | | |
|---|---|---|---|---|
| 4,597,228 A * | 7/1986 | Koyama | ................. | B24B 7/228 451/289 |
| 5,534,073 A * | 7/1996 | Kinoshita | ............. | B25B 11/005 118/725 |
| 6,032,715 A * | 3/2000 | Ohkubo | ................ | B25B 11/005 156/538 |
| 6,422,922 B1 * | 7/2002 | Okamura | ................ | B24B 37/30 451/287 |
| 7,649,157 B2 * | 1/2010 | Iizuka | ................ | B23K 26/0648 219/121.82 |
| 9,117,869 B2 * | 8/2015 | Kusunose | ........... | H01L 21/6838 |
| 2002/0115392 A1 * | 8/2002 | Kawashima | .......... | B24B 37/345 451/289 |
| 2005/0067097 A1 * | 3/2005 | Yamamoto | ........ | H01L 21/67092 156/706 |

(Continued)

FOREIGN PATENT DOCUMENTS

JP 2002-192370 7/2002

*Primary Examiner* — Eric A. Gates
*Assistant Examiner* — Paul M Janeski
(74) *Attorney, Agent, or Firm* — Greer Burns & Crain, Ltd.

(57) ABSTRACT

A chuck table for holding a plate-shaped workpiece under suction includes a suction plate made of porous ceramics and having a plurality of open pores, and a frame covering a side surface and a reverse side, except an attractive suction surface, of the suction plate and having a plurality of suction grooves defined in an upper surface thereof and a fluid communication passage defined therein that holds the suction grooves in fluid communication with a suction source, the frame supporting the suction plate thereon. The suction plate has a porosity in the range from 60% to 70% by volume, and the open pores have diameters in the range from 10 μm to 25 μm.

13 Claims, 3 Drawing Sheets

(56) References Cited

U.S. PATENT DOCUMENTS

| | | | |
|---|---|---|---|
| 2007/0045799 A1* | 3/2007 | Sekiya | H01L 21/67132 257/678 |
| 2007/0063453 A1* | 3/2007 | Ishikawa | B24B 37/30 279/3 |
| 2015/0214085 A1* | 7/2015 | Jin | H01L 21/6838 414/806 |

* cited by examiner

CHUCK TABLE AND METHOD OF MANUFACTURING SUCTION PLATE OF POROUS CERAMICS

BACKGROUND OF THE INVENTION

Field of the Invention

The present invention relates to a chuck table for holding a flat surface of a workpiece under suction, and a method of manufacturing a suction plate of porous ceramics that serves as part of such a chuck table.

Description of the Related Art

It has been customary to grind the reverse side of a wafer, which has a plurality of devices such as integrated circuits (ICs), large scale integration (LSI) circuits, or the like formed on a face side thereof and demarcated by projected dicing lines, with a grinding apparatus until the wafer is ground to a predetermined thickness, form division starting points in the wafer with a laser processing apparatus, and apply external forces to the wafer to divide the wafer into individual device chips, which will be used in electric appliances such as mobile phones, personal computers, etc.

The laser processing apparatus generally includes an air-permeable chuck table for holding a wafer thereon, laser beam applying means for irradiating the wafer held on an attractive suction surface of the chuck table with a laser beam having a wavelength with which the wafer is permeable, X-axis moving means for moving the chuck table and the laser beam applying means relatively to each other in X-axis directions, and Y-axis moving means for moving the chuck table and the laser beam applying means relatively to each other in Y-axis directions. The laser processing apparatus is capable of forming modified layers that provide division starting points in the wafer along the projected dicing lines (see, for example, Japanese Patent No. 3408805).

SUMMARY OF THE INVENTION

The conventional laser processing apparatus is arranged on the premise that the attractive suction surface of the chuck table for holding a wafer as a workpiece thereon has a size set to match the shape and size of the wafer and is covered in its entirety with the wafer. Therefore, the porosity of a suction plate of porous ceramics that serves as part of the chuck table and the size of open pores in the suction plate are set such that the load imposed on a suction source connected to the chuck table when there is nothing placed on the attractive suction surface is as small as possible. The pressure in the internal space of the chuck table is set to approximately 0.9 atm, for example.

When a wafer smaller than the attractive suction surface is placed thereon and the suction source is actuated in an attempt to hold the wafer under suction on the attractive suction surface, a large amount of ambient air is drawn into the chuck table through the exposed outer circumferential portion of the attractive suction surface that is not covered with the wafer, making it hard to hold the wafer under suction on the attractive suction surface. Heretofore, therefore, each time a wafer having a different size is to be processed, the chuck table that has been used thus far needs to be replaced with another chuck table having a diameter corresponding to the different size of the wafer. The process of replacing the chuck table tends to lead to poor productivity. Another problem is that since it is necessary to keep a plurality of chuck tables having different diameters in stock in order to deal with wafers having different sizes and/or shapes, inventory control is rather burdensome.

These problems occur not only with laser processing apparatus for processing wafers, but also with inspection apparatus for inspecting whether devices on a wafer held on the attractive suction surface of a chuck table are acceptable or not.

It is therefore an object of the present invention to provide a chuck table that is capable of holding workpieces well even if the workpieces have different sizes and/or shapes, and a method of manufacturing a suction plate of porous ceramics.

In accordance with an aspect of the present invention, there is provided a chuck table for holding a plate-shaped workpiece under suction, including a suction plate made of porous ceramics and having a plurality of open pores, and a frame covering a side surface and a reverse side, except an attractive suction surface, of the suction plate and having a plurality of suction grooves defined in an upper surface thereof and a fluid communication passage defined therein that holds the suction grooves in fluid communication with a suction source, the frame supporting the suction plate thereon. The suction plate has a porosity in the range from 60% to 70% by volume, and the open pores have diameters in the range from 10 to 25 μm.

In accordance with another aspect of the present invention, there is provided a chuck table for holding a plate-shaped workpiece under suction, including a suction plate made of porous ceramics and having a plurality of open pores, and a frame having a plurality of suction grooves defined in a surface thereof and a fluid communication passage defined therein that holds the suction grooves in fluid communication with a suction source, the frame covering a side surface and a reverse side, except an attractive suction surface, of the suction plate, and the frame supporting the suction plate thereon. The porosity of the suction plate and the diameters of open pores of the suction plate are set such that when a vacuum pump as the suction source connected to the fluid communication passage through a suction channel is actuated with nothing placed on the attractive suction surface of the suction plate, a pressure gage connected to the suction channel indicates a pressure value in the range from 0.3 to 0.6 atm.

In accordance with a further aspect of the present invention, there is provided a method of manufacturing a suction plate of porous ceramics, including the steps of producing granules having diameters equal to or smaller than 200 μm by mixing feldspar, pottery stone, clay, and talc, crushing the mixture with a ball mill, and mixing the crushed mixture with a sizing agent, forming a plate-shaped product by pressing the granules, and sintering the formed product at a temperature ranging from 800° C. to 1300° C. to produce a suction plate of porous ceramics.

In accordance with a still further aspect of the present invention, there is provided a suction holding system for holding a plate-shaped workpiece under suction, including a suction plate made of porous ceramics and having a plurality of open pores, a frame having a plurality of suction grooves defined in a surface thereof and a fluid communication passage defined therein which has an end held in fluid communication with the suction grooves, the frame covering a side surface and a reverse side, except an attractive suction surface, of the suction plate, and the frame supporting the suction plate thereon, and a suction source connected to another end of the fluid communication passage. The porosity of the suction plate, the diameters of open pores of the suction plate, and the pressure of the pressure source are set such that when the suction source is actuated with nothing placed on the attractive suction surface of the suction plate, the pressure in the fluid communication passage keeps the plate-shaped workpiece held under suction on the attractive suction surface even if the area of the plate-shaped workpiece on the attractive suction surface is smaller than the area of the attractive suction surface.

The chuck table according to the present invention includes the suction plate made of porous ceramics and having the open pores, the frame covering the side surface and the reverse side, except the attractive suction surface, of the suction plate, and the fluid communication passage defined in the frame and held in fluid communication with the suction source. The open pores defined in the suction plate are capable of holding a flat surface of the workpiece under suction even if the area of the flat surface of the workpiece to be held under suction is smaller than the area of the attractive suction surface. Therefore, even if a planar workpiece such as a wafer to be held under suction has a different diameter and/or shape, the chuck table does not need to be replaced with a different chuck table, but is able to hold the workpiece under suction, allowing the workpiece to be processed or inspected efficiently while securely held in place. Since it is not necessary to keep a plurality of chuck tables having different diameters in stock in order to deal with workpieces having different sizes and/or shapes, no burdensome inventory control is required for the chuck table.

The above and other objects, features and advantages of the present invention and the manner of realizing them will become more apparent, and the invention itself will best be understood from a study of the following description and appended claims with reference to the attached drawings depicting some preferred embodiment of the invention.

DETAILED DESCRIPTION OF THE PREFERRED EMBODIMENT

Figure 1:
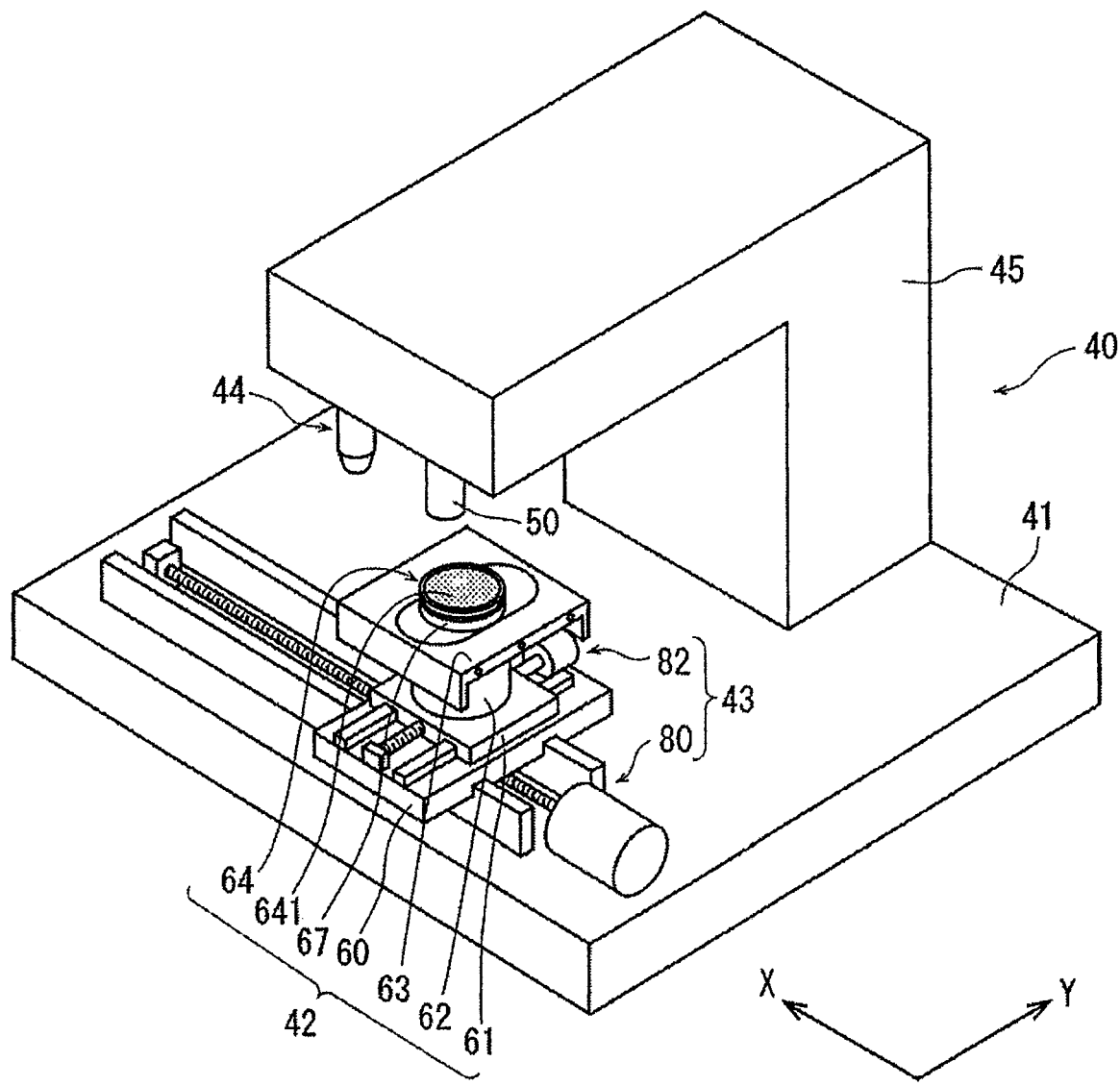
FIG. 1 is a perspective view of a laser processing apparatus which incorporates therein a chuck table according to the present invention.

A chuck table, a method of manufacturing a suction plate of porous ceramics that serves as part of a chuck table, and a suction holding system according to an embodiment of the present invention will be described in detail below with reference to the accompanying drawings. FIG. 1 depicts in perspective a laser processing apparatus 40 as an example of apparatus which incorporates a chuck table according to the present invention.

As depicted in FIG. 1, the laser processing apparatus 40 includes a base 41, holding means 42 for holding a workpiece such as a wafer having a given size with a protective tape not shown, moving means 43 for moving the holding means 42, a laser beam applying mechanism 44 for applying a laser beam to a workpiece held by the holding means 2, and imaging means 50.

The holding means 42 has a rectangular X-axis direction movable plate 60 movably mounted on the base 41 for movement in an X direction indicated by the arrow X, a rectangular Y-axis direction movable plate 61 movably mounted on the X-axis direction movable plate 60 for movement in a Y direction indicated by the arrow Y, a hollow cylindrical support post 62 fixedly mounted on the upper surface of the Y-axis direction movable plate 61, and a rectangular cover plate 63 fixed to the upper end of the support post 62. On the cover plate 63, there is disposed a chuck table 64 for holding thereon a circular workpiece, the chuck table 64 extending upwardly through an oblong hole defined in the cover plate 63. The chuck table 64 is disposed on a support base 67 that supports the chuck table 64. The chuck table 64 has an attractive suction surface as an upper surface thereof which is provided by a suction plate 641 that is held in fluid communication with a suction source, to be described later, through a fluid channel extending through the support post 62. The X direction indicated by the arrow X in FIG. 1 and the Y direction indicated by the arrow Y in FIG. 1 are perpendicular to each other.

The moving means 43 includes X-axis direction moving means 80 and Y-axis direction moving means 82. The X-axis direction moving means 80 converts rotary motion from a motor into linear motion and transmits the linear motion to the X-axis direction movable plate 60, moving the X-axis direction movable plate 60 selectively in the X direction or the opposite direction thereto along guide rails on the base 41. The Y-axis direction moving means 82 converts rotary motion from a motor into linear motion and transmits the linear motion to the Y-axis direction movable plate 61, moving the Y-axis direction movable plate 61 selectively in the Y direction or the opposite direction thereto along guide rails on the X-axis direction movable plate 60. Position detecting means, not depicted, are disposed on the X-axis direction moving means 80 and the Y-axis direction moving means 82, for accurately detecting respective positions in the X and Y directions of the chuck table 64. The position detecting means output signals indicating the detected positions to control means, not depicted, which sends control signals to the X-axis direction moving means 80 and the Y-axis direction moving means 82 to move the chuck table 64 accurately to desired positions in the X and Y directions. The imaging means 50 is positioned above the holding means 42, and captures an image of a workpiece such as a wafer placed on the chuck table 64 by moving the chuck table 64.

A wafer transported to and held on the chuck table 64 can be processed by a laser beam with use of the above mentioned laser processing apparatus 40. Specifically, a wafer, not depicted, held on the suction plate 641 of the chuck table 64 has alignment marks representing the directions of projected dicing lines on the wafer, along which the wafer is to be processed by the laser beam from the laser beam applying mechanism 44. The imaging means 50 captures an image of alignment marks, and the control means performs an image processing process such as pattern matching on the captured image, then carries out an alignment process to adjust the relative position and direction of the wafer with respect to a beam condenser of the laser beam applying mechanism 44, and performs a laser processing on the wafer. During the laser processing on the wafer, regions adjacent to the cover plate 63 in the X-axis direction are covered with bellows means, not depicted, that is expandable and contractible as the chuck table 64 is moved, so that dust and dirt will not enter the regions of the moving means 43. As the bellows means has no direct bearing on the present invention, it will not be described in detail below.

Figure 2A:
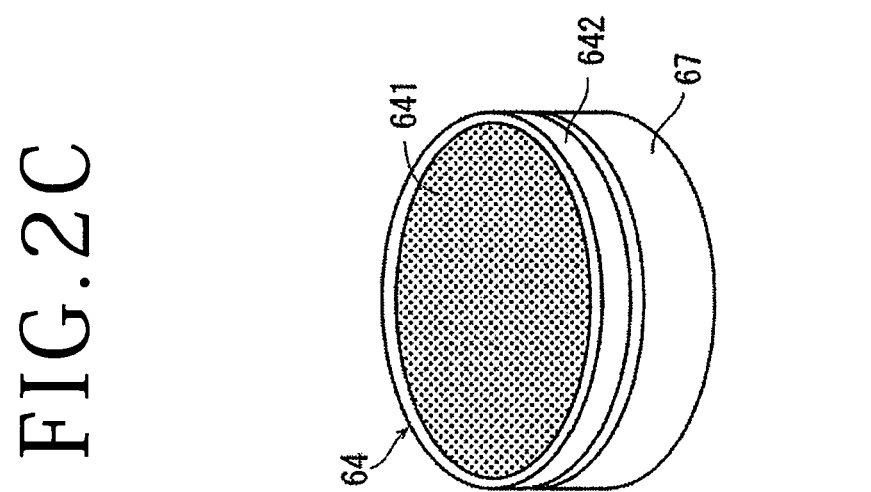
FIGS. 2A, 2B, and 2C are enlarged perspective views of a chuck table incorporated in the laser processing apparatus depicted in FIG. 1 and a support base that supports the chuck table.
Figure 2B:
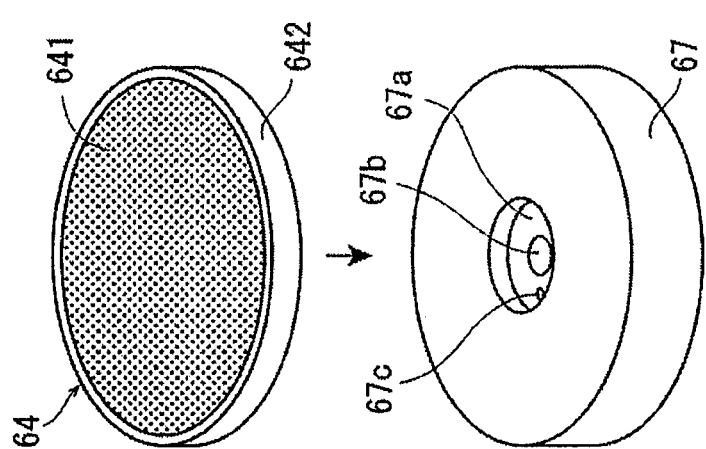
Figure 2C:
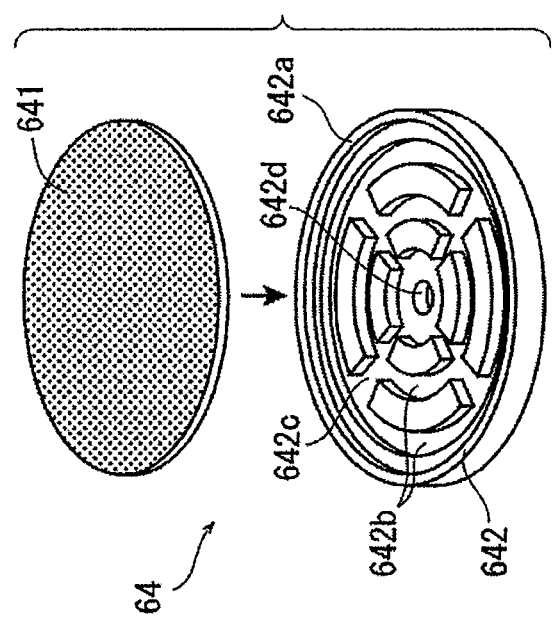

As depicted in FIGS. 2A through 2C at an enlarged scale, the chuck table 64 includes the suction plate 641, which is made of porous ceramics as an air-permeable porous material, and a frame 642 (see FIG. 2A) of ceramics covering the side surface and the reverse side, except the attractive suction surface, of the suction plate 641. The chuck table 64 is mounted on the upper surface of the support base 67, which is made of stainless steel (SUS), with a clearance left therebetween (see FIG. 2B), integrally combined with the support base 67 (see FIG. 2C), and incorporated in the laser processing apparatus 40. As depicted in FIG. 2A, the frame 642 that surrounds the suction plate 641 has an outer rim 642a on its upper surface which covers the side surface of the suction plate 641. When the suction plate 641 is held on the frame 642, the upper surface of the outer rim 642a and the upper surface of the suction plate 641 lie flush with each other. The upper surface of the frame 642 that supports the reverse surface of the suction plate 641 thereon has defined therein a plurality of concentric suction grooves 642b and a plurality of joint suction grooves 642c that interconnect the concentric suction grooves 642b and is radially expandable and contractible. The frame 642 also has a central fluid communication passage 642d defined therethrough that is held in fluid communication with a suction source P (see FIG. 3) for supplying a negative pressure therethrough to a space defined between the suction plate 641 and the frame 642. The frame 642 has a circular boss 642e (see FIG. 3) disposed centrally on its lower surface. The frame 642 may be made of stainless steel (SUS), for example, rather than ceramics.

Figure 3:
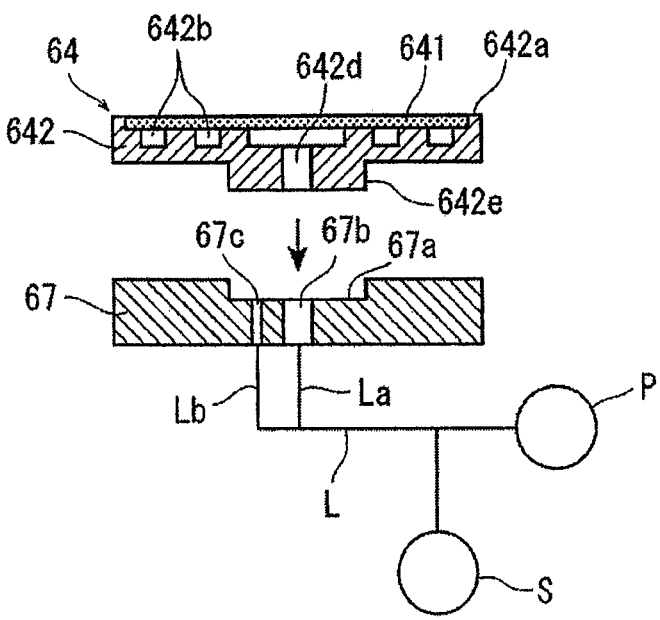
FIG. 3 is a cross-sectional view illustrating a suction holding system.

The support base 67 has a circular recess 67a defined centrally in its upper surface for receiving the circular boss 642e, which projects downwardly in the lower surface of the chuck table 64, to be fitted therein. The support base 67 also has a fluid communication passage 67b defined centrally therein through the bottom of the circular recess 67a for supplying the negative pressure therethrough and also through the fluid communication passage 642d to the space defined between the suction plate 641 and the frame 642 for attracting a workpiece under suction to the suction plate 641. The bottom of the circular recess 67a also has a suction hole 67c defined therethrough for attracting under suction the bottom surface of the circular boss 642e fitted in the circular recess 67a thereby to secure the chuck table 64 under suction on the support base 67. As depicted in FIG. 3, the fluid communication passage 67b and the suction hole 67c are connected to the suction source P, which includes a vacuum pump, through auxiliary suction channels La and Lb branched from a suction channel L, thus providing a suction holding system. In the illustrated embodiment, a pressure gage S is connected to the suction channel L for measuring the pressure in a section that includes the fluid communication passage 67b, the suction channel L, and the auxiliary suction channels La and Lb.

The chuck table 64 thus constructed serves to hold a disk-shaped semiconductor wafer, for example, as a workpiece under suction on the suction plate 641 with a negative pressure from the suction source P. While holding the workpiece under suction on the suction plate 641, the chuck table 64 is rotated about its own axis by a pulse motor, not depicted, housed in the hollow cylindrical support post 62. The suction holding system, which includes at least the chuck table 64, the support base 67, and the suction source P, will be described below with reference to FIG. 3.

The suction plate 641 of the chuck table 64 can be manufactured by a manufacturing method including a granule producing step for producing granules having diameters equal to or smaller than 200 μm by mixing feldspar, pottery stone, clay, and talc, crushing the mixture with a ball mill, and mixing the crushed mixture with a sizing agent such as methyl cellulose or the like, a forming step for forming a plate-shaped product by pressing the granules, and a sintering step for sintering the formed product at a temperature ranging from 800° C. to 1300° C. to produce a suction plate of porous ceramics.

The porous ceramics of the suction plate 641 thus manufactured by the above manufacturing method has a porosity in the range from 60% to 70% by volume, and the open pores in the porous ceramics have diameters in the range from 10 to 25 μm. Adjustments are made such that when the suction source P connected to the chuck table 64 is actuated with nothing placed on the attractive suction surface of the suction plate 641, the pressure gage S connected to the suction channel L indicates a pressure value smaller than 0.9 atm with the conventional laser processing apparatus, preferably in the range from 0.3 to 0.6 atm.

According to the present invention as described above, not only a semiconductor wafer having the same shape and size as the suction plate 641, but also a wafer W1 (see FIG. 4A) smaller than the suction plate 641 or a wafer W2 (see FIG. 4B) that is rectangular in shape, can be well held under suction on the chuck table 64, i.e., the suction plate 641 while the wafer is being processed by the laser processing apparatus 40.

Figure 4A:
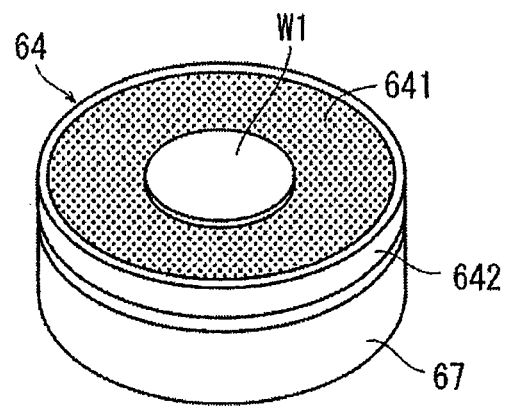
FIGS. 4A and 4B are perspective views depicting examples in which the chuck table is used.
Figure 4B:
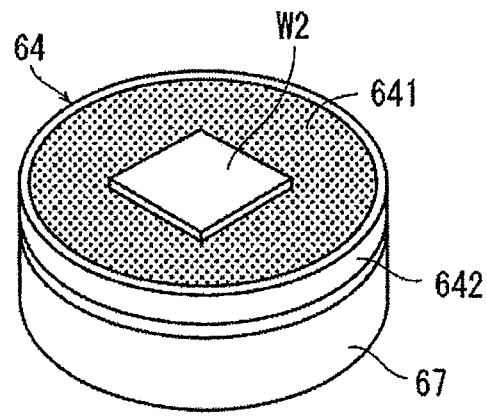

As depicted in FIGS. 4A and 4B, ambient air tends to be drawn into the chuck table 64 through an exposed region in the suction plate 641 where the wafer W1 or W2 is not present. However, since the porosity and the diameters of the open pores of the suction plate 641 according to the above embodiment are set to values smaller than those of the conventional suction plate, the negative pressure in the chuck table 64 is kept larger than the negative pressure in the conventional chuck table, enabling the suction plate 641 to hold the wafer W1 or W2 under suction thereon.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A chuck table for holding a plate-shaped workpiece under suction, comprising:
    a suction plate made of porous ceramics and having a plurality of open pores;
    a frame covering a side surface and a reverse side, except an attractive suction surface, of said suction plate and having a plurality of suction grooves defined in an upper surface thereof and a fluid communication passage defined therein that holds said suction grooves in fluid communication with a suction source, said frame supporting said suction plate thereon; and
    a support base configured and arranged for supporting said frame, wherein said support base includes a circular recess therein; and
    wherein said frame includes a circular boss projecting from a lower surface thereof,
    wherein said circular recess of said support base is configured and arranged for receiving said circular boss of said frame therein, and wherein said suction plate has a porosity in the range from 60% to 70% by volume, and said open pores have diameters in the range from 10 to 25 μm.

2. The chuck table according to claim 1, wherein said plurality of suction grooves includes a plurality of concentric suction grooves and a plurality of joint suction grooves that interconnect said plurality of concentric suction grooves.

3. The chuck table according to claim 2, wherein said plurality of joint suction grooves extend in the radial direction.

4. The chuck table according to claim 1, further comprising a suction hole defined within said support base, wherein said suction hole is configured and arranged for attracting, under suction, a bottom surface of said circular boss to thereby secure said frame and said support base together under suction.

5. A chuck table for holding a plate-shaped workpiece under suction, comprising:
a suction plate made of porous ceramics and having a plurality of open pores; and
a frame having a plurality of suction grooves defined in a surface thereof and a fluid communication passage defined therein that holds said suction grooves in fluid communication with a suction source, said frame covering a side surface and a reverse side, except an attractive suction surface, of said suction plate, and said frame supporting said suction plate thereon, wherein said plurality of suction grooves includes a plurality of concentric suction grooves and a plurality of joint suction grooves that interconnect said plurality of concentric suction grooves; and
a support base configured and arranged for supporting said frame, wherein said support base includes a circular recess therein; and
wherein said frame includes a circular boss projecting from a lower surface thereof,
wherein said circular recess of said support base is configured and arranged for receiving said circular boss of said frame therein, and
wherein the porosity of said suction plate and the diameters of open pores of said suction plate are set such that when a vacuum pump as said suction source connected to said fluid communication passage through a suction channel is actuated with nothing placed on the attractive suction surface of said suction plate, a pressure gage connected to said suction channel indicates a pressure value in the range from 0.3 to 0.6 atm.

6. The chuck table according to claim 5, wherein said plurality of joint suction grooves extend in the radial direction.

7. The chuck table according to claim 5, further comprising a suction hole defined within said support base, wherein said suction hole is configured and arranged for attracting, under suction, a bottom surface of said circular boss to thereby secure said frame and said support base together under suction.

8. A method of manufacturing a suction plate of porous ceramics, comprising:
a granule producing step for producing granules having diameters equal to or smaller than 200 μm by mixing feldspar, pottery stone, clay, and talc, crushing the mixture with a ball mill, and mixing the crushed mixture with a sizing agent;
a forming step for forming a plate-shaped product by pressing the granules; and
a sintering step for sintering the formed product at a temperature ranging from 800° C. to 1300° C. to produce a suction plate of porous ceramics.

9. The method for manufacturing a suction plate according to claim 8, wherein said suction plate formed by said method has a porosity in the range from 60% to 70% by volume, and said open pores have diameters in the range from 10 to 25 μm.

10. A suction holding system for holding a plate-shaped workpiece under suction, comprising:
a suction plate made of porous ceramics and having a plurality of open pores;
a frame having a plurality of suction grooves defined in a surface thereof and a single fluid communication passage defined therein which has an end held in fluid communication with all of said suction grooves, said frame covering a side surface and a reverse side, except an attractive suction surface, of said suction plate, and said frame supporting said suction plate thereon;
a suction source connected to another end of said single fluid communication passage; and
a support base configured and arranged for supporting said frame, wherein said support base includes a circular recess therein; and
wherein said frame includes a circular boss projecting from a lower surface thereof, and
wherein said circular recess of said support base is configured and arranged for receiving said circular boss of said frame therein,
wherein the porosity of said suction plate, the diameters of open pores of said suction plate, and the pressure of said pressure source are set such that when said suction source is actuated with nothing placed on the attractive suction surface of said suction plate, the pressure from said single fluid communication passage keeps the plate-shaped workpiece held under suction on said attractive suction surface even if the area of said plate-shaped workpiece on said attractive suction surface is smaller than the area of said attractive suction surface.

11. The suction holding system according to claim 10, further comprising a suction hole defined within said support base, wherein said suction hole is configured and arranged for attracting, under suction, a bottom surface of said circular boss to thereby secure said frame and said support base together under suction.

12. The suction holding system according to claim 10, wherein said plurality of suction grooves includes a plurality of concentric suction grooves and a plurality of joint suction grooves that interconnect said plurality of concentric suction grooves.

13. The suction holding system according to claim 12, wherein said plurality of joint suction grooves extend in the radial direction.

* * * * *